(12) United States Patent
Yoshida et al.

(10) Patent No.: US 7,387,870 B2
(45) Date of Patent: *Jun. 17, 2008

(54) METHOD FOR MANUFACTURING CERAMIC GREEN SHEET AND METHOD FOR MANUFACTURING ELECTRONIC PART USING THAT CERAMIC GREEN SHEET

(75) Inventors: Masayuki Yoshida, Tokyo (JP); Junichi Sutoh, Tokyo (JP); Shunji Aoki, Tokyo (JP); Genichi Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 192 days.

This patent is subject to a terminal disclaimer.

(21) Appl. No.: 10/926,042

(22) Filed: Aug. 26, 2004

(65) Prior Publication Data

US 2005/0048415 A1 Mar. 3, 2005

(30) Foreign Application Priority Data

Aug. 28, 2003 (JP) ............................. 2003-304209

(51) Int. Cl.
*B29C 65/14* (2006.01)
*G03C 5/00* (2006.01)
*B32B 37/02* (2006.01)

(52) U.S. Cl. ..................... 430/322; 430/320; 430/311; 156/89.12; 156/272.8

(58) Field of Classification Search ..................... None
See application file for complete search history.

(56) References Cited

U.S. PATENT DOCUMENTS 6,159,322 A * 12/2000 Ogata et al. ................. 156/230

2005/0048415 A1 3/2005 Yoshida et al.
2005/0079450 A1* 4/2005 Yoshida et al. ............. 430/322

FOREIGN PATENT DOCUMENTS

| JP | 4-215414 A | 8/1992 |
| JP | 8-023102 A | 1/1996 |
| JP | 9-115766 A | 5/1997 |
| JP | 2001-085264 A | 3/2001 |
| JP | 2001-110662 A | 4/2001 |
| JP | 2002-026046 A | 1/2002 |
| JP | 2002-184648 A | 6/2002 |
| JP | 2002-221801 A | 8/2002 |
| JP | 2003-048303 A | 2/2003 |
| JP | 2004-179181 | 6/2004 |

OTHER PUBLICATIONS

U.S. Appl. No. 10/926,033, filed Aug. 26, 2004, Yoshida et al.
U.S. Appl. No. 10/926,042, filed Aug. 26, 2004, Yoshida et al.
U.S. Appl. No. 10/543,710, filed Jul. 28, 2005, Yoshida et al.

* cited by examiner

*Primary Examiner*—John A. McPherson
*Assistant Examiner*—Daborah Chacko Davis
(74) *Attorney, Agent, or Firm*—Oblon, Spivak, McClelland, Maier & Neustadt, P.C.

(57) ABSTRACT

The invention relates to a so-called ceramic green sheet used for manufacturing multilayer ceramic electronic parts. The invention is intended to improve accuracy in shape of an electrode or other element formed on the sheet, accuracy in its position and uniformity in its thickness. In a process according to the invention, a layer made of a photosensitive material including a powder having a desired electric characteristic is formed on a light transmissive base member. A mask having a desired pattern is disposed on the back side of the base member and the photosensitive material is exposed from the back side of the base member through the mask. Then the photosensitive layer after the exposure is subjected to development.

6 Claims, 4 Drawing Sheets

METHOD FOR MANUFACTURING CERAMIC GREEN SHEET AND METHOD FOR MANUFACTURING ELECTRONIC PART USING THAT CERAMIC GREEN SHEET

BACKGROUND OF THE INVENTION

1. Field of the Invention

The present invention relates to a method for manufacturing an electronic part, especially an electronic part that is formed by laminating ceramic layers, which is exemplified by a so-called multilayer ceramic electronic part. The present invention also relates to a method for manufacturing a so-called ceramic green sheet used in the aforementioned method. Examples of the multiplayer ceramic electronic part mentioned here include multilayer ceramic capacitors, multilayer ceramic inductors, LC composite parts including capacitors and inductors formed therein, or EMC related parts etc..

2. Related Background Art

In recent years, with downsizing and rapid popularization of electronic apparatuses represented by cellular phones, an increase in mounting density of the electronic parts used for those apparatuses and improvement in their performance are required. Especially, demands for downsizing, decrease in thickness, increase in the number of layers and uniformization of each layer are placed on multilayer ceramic electronic parts that are used as passive elements in order to meet the above requirements. In addition, development of the manufacturing method that can meet those requirements is also demanded.

So called metal-ceramic combined baking, disclosed in, for example. Japanese Patent Application Laid-Open No. 2001-110662 and Japanese Patent Application Laid-Open No. 2001-85264, is a conventional manufacturing method used for manufacturing the aforementioned multilayer ceramic electronic parts exemplified by multilayer ceramic capacitors having electrodes formed in the interior thereof, which can meet the aforementioned requirements. Here, this metal-ceramic combined baking technology will be described briefly. In this technology, a plurality of electrodes are formed on a so-called ceramic green sheet at the same time using an electrically conductive paste composed of a metal powder and an organic binder material.

Subsequently, a plurality of simple ceramic green sheets and ceramic green sheets on which electrodes have been formed etc. are stacked to form a ceramic multilayer member. The electrodes will constitute the internal electrodes of a multilayer ceramic electronic part when it is finished. In addition, the ceramic multilayer member is pressed in its thickness direction so that the green sheets will be brought into close contact with each other. The multilayer member brought into close contact is cut into a certain size and separated so as to be subjected to baking. On the outer surface of the baked member thus obtained, external electrodes are formed fitly. Thus, a multilayer ceramic electronic part is obtained.

In recent years, further downsizing and thickness reduction of the aforementioned multilayer ceramic electronic parts have been required, and it is necessary to reduce the thickness of dielectric layers made of a ceramic or the like sandwiched between internal electrodes. Therefore, it is required to perform the above-described process while further reducing the thickness of ceramic green sheets that constitutes the ceramic multilayer member. In view of these requirements, the thickness of the thinnest ceramic green sheet presently used is about 2 to 3 μm. In addition, the thickness of electrodes printed on the ceramic green sheets is about 1.5 to 2.0 μm.

The thickness of the ceramic green sheets and the electrodes formed on the surface thereof, the width and pattern shape of the electrodes, are substantially determined at the time when they are formed, and it is practically impossible to add a process of shaping them after they are formed. Conventionally, the electrodes or the like are formed by screen printing. In the screen printing, variations in the thickness in the formed area is ±10 to 20%, and the limit value of the pattern width that can be formed is considered to be about 50 μm. As disclosed in Japanese Patent Application Laid-Open No. 2002-184648, on the surface of a sheet produced by the screen printing, there is unevenness like an impression of a mesh. In view of this, new production method is required to be devised in order to produce sheets having improved uniformity in thickness and improved surface evenness.

As one solution, there has been proposed a technology in which a sheet or layer having a desired thickness is formed by a ceramic slurry having photosensitivity or an electrode paste having photosensitivity, so that they are subjected to exposure and development processing to produce electrodes or the like with high accuracy in the width and shape etc. With that method it is possible to make the pattern width thinner and the positional accuracy of pattern formation can also be enhanced as compared to the printing process. However, in the case that the layer to be exposed is formed by a printing process, there will be the aforementioned unevenness of the layer surface, and the unevenness will remain unchanged even when ordinary exposure and development processing has been applied.

It may be possible to reduce the unevenness by applying mechanical processing such as pressing to the sheet or the layer after the sheet or the layer is formed. However, it is not desirable because the process will be lengthy. A method using a coater or spin coating process is another method for forming a sheet or a layer having no or reduced unevenness. However, on the surface of the layer obtained by the aforementioned coating process, there remains traces of a blade or the like and the variations in the thickness is ±3 to 5%, which still remains after the exposure and development processing. Therefore, in order to manufacture electronic parts having improved characteristics, improvement in the surface evenness or reduction of the variations in the thickness is required.

In the case that metal paste is applied on a base member by screen printing or using a coater to form an electrode layer, sag of the edge portion of the electrode or deterioration in straightness of the edge portion can occur depending on conditions such as viscosity of the metal paste etc. In addition, a run-over or faded portion can be generated upon application of slurry, which can cause short-circuit or conduction failure when assembled into an electronic part. Furthermore, upon reducing the coating thickness, there is the lower limit of the thickness of the coating that can be formed depending on various condition such as viscosity. Furthermore, it is difficult to reduce variations in the dimension in the thickness direction down to less than a few percent. This is also the case when a ceramic green sheet is produced using a ceramic slurry.

In the case of a ceramic green sheet that is used for forming an electronic part in the form of an inductor, a penetrating electrode or the like may be formed in some cases. In that case, it is desirable that the length of the penetrating electrode (or the thickness of the electrode) be controlled precisely in order to make electric characteristics of the inductor definite. However, at present, the thickness of the electrode is determined in accordance with the thickness of the ceramic sheet and it is practically difficult to control the thickness of the electrode independently from the thickness of the ceramic green sheet, as will be seen from Japanese Patent Application Laid-Open No. 2003-48303.

SUMMARY OF THE INVENTION

The present invention has been made in view of the above-described problems and situations. An object of the present invention is to provide a method for manufacturing a ceramic green sheet and an electrode layer with which their surface evenness or uniformity of thickness is improved. Another object of the present invention is to reduce variations in electric characteristics of multilayer ceramic electronic parts by means of the above-mentioned method so as to provide electronic parts having improved electric characteristics.

In order to solve the aforementioned problem, according to the present invention there is provided a method for manufacturing a ceramic green sheet utilizing an exposure process and an development process, comprising a step of attaching a photosensitive material including a powder having a specific electric characteristic to a front side surface of a member having a portion that can transmit light used in the exposure process, wherein the photosensitive material is sensitive to the light, and the front side surface is a surface on which a sheet is to be formed, a step of shaping the light into a predetermined pattern and irradiating the photosensitive material with that light from the back side of the aforementioned member to perform the exposure process with such an exposure amount that only a portion of the photosensitive material that is within a predetermined depth from the surface of aforementioned member will undergo the exposure, and a step of performing the development process on the photosensitive material after the exposure process.

In the above-described sheet manufacturing method, it is preferable that the light is shaped into the aforementioned predetermined pattern by passing through a mask disposed on the back side of the aforementioned member. In addition, the above-described sheet manufacturing method may further includes a step of forming a light blocking portion composed of a material that does not transmit the light on a predetermined area of the front side surface of the aforementioned member, prior to the step of attaching the photosensitive material to the front side surface of the aforementioned member. Furthermore, in the above-described sheet manufacturing method, the aforementioned predetermined depth may be equal to the thickness of the light blocking portion.

Still further, in the above-described sheet manufacturing method, a releasing processing may be applied to the aforementioned member to facilitate release of the ceramic green sheet from the surface of the aforementioned member. In addition, in the above-described sheet manufacturing method, the aforementioned member may include a portion to be detached and removed from the ceramic green sheet and a portion that will constitute a part of the ceramic green sheet.

In order to solve the aforementioned problem, according to another aspect of the invention, there is provided a method for manufacturing a multilayer ceramic electronic part comprising a step of stacking a plurality of ceramic green sheets including a ceramic green sheet produced by the above-described method for manufacturing a ceramic green sheet, and a step of applying a pressure to the stacked ceramic green sheets in their thickness direction to form a laminated member.

According to the present invention, a layer formed by a conventional process of applying a photosensitive material for example using a coater or screen printing is processed through exposure and development so that improvement in accuracy of its position, shape and thickness can be realized. More specifically, it is possible to improve the pattern shape of an electrode, eliminate run-over or sag of the electrode and make the electrode surface even. Consequently, it is possible to reduce the occurrence of defects such as short circuit between electrodes, even if an insulating layer is thin. Therefore, it is possible to produce a sheet used for forming multilayer electronic parts having improved quality as compared to conventional sheets only by adding the process according to the present invention to a conventional mass production process.

Furthermore, according to the present invention, it is possible to process and control the pattern shape and the layer thickness simultaneously. Consequently, upon forming a layer including a pattern or a through hole, it is possible to shape or process the layer with excellent accuracy in its shape and thickness. Thus, it is possible to manufacture a preferable sheet to be used for manufacturing multilayer electronic parts having a shape closer to an ideal shape than in conventional methods. More specifically, it is possible to produce a sheet having a pattern width of about 30 μm with variations in thickness of ±2-3% or less.

DESCRIPTION OF THE PREFERRED EMBODIMENTS

Figure 1:
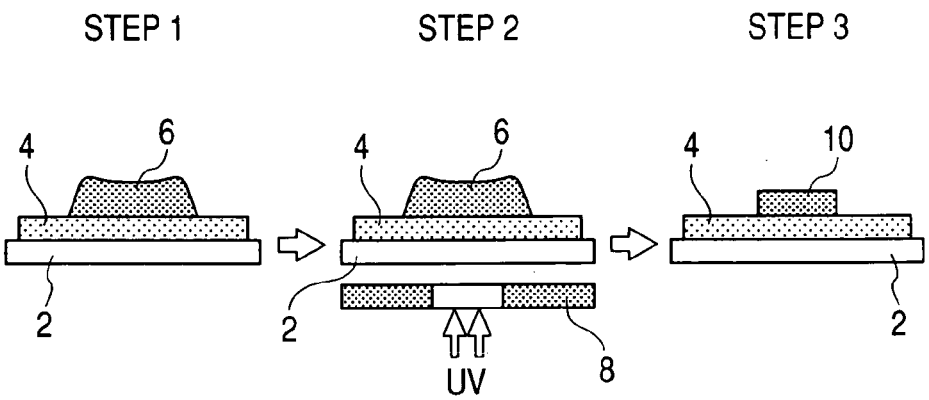
FIG. 1 is schematically shows a ceramic green sheet manufacturing process according to a first embodiment of the present invention.

An embodiment of a method of producing a sheet (i.e. a so-called ceramic green sheet) used in an electronic part manufacturing process according to the present invention will be described briefly. In this embodiment, a layer made of a photosensitive material containing powder having a desired electric characteristic is firstly formed on the surface of a base member that can transmit light such as ultraviolet light used in an exposure process that will be described later. The photosensitive material that constitutes the layer is sensitive to the aforementioned light such as ultraviolet light. Subsequently, a mask having a desired pattern is disposed on the back side of the base member and the back side of the base member is irradiated with light such as ultraviolet light through the mask so that the photosensitive material is exposed. After that, the photosensitive material after the exposure is subjected to a development process, and the base member is detached from the photosensitive material. Thus, a ceramic green sheet having a desired shape and layer is obtained.

Although the photosensitive material used in this embodiment is sensitive to light such as ultraviolet light, the light to be used is not limited to ultraviolet light as long as a specific light and a material that is sensitive to that light are used in combination. The aforementioned desired properties include, for example, electro-conductivity, permittivity and resistance. The method of attaching the photosensitive material to the base member is, for example, coating or printing, though the method is not limited to them. An example of the base member is a PET film that is transparent to light. A member on which releasing processing for facilitating release of a layer formed on the base member is applied may be used as the base member. A member on which a plurality of light transmissive layers are formed may be used as the base member. Although it is preferable that the aforementioned mask having a predetermined pattern be in close contact with the back surface of the base member, it may be disposed spaced apart from the back surface of the base member depending on the exposure condition or other conditions.

In this embodiment, the light used for the exposure process of the photosensitive layer is patterned through the mask disposed on the back side of the base member. However, the position of the mask is not limited to the back side of the base member. A light blocking part that functions in the same manner as the mask may be provided on the base member itself. Alternatively, a light blocking layer having the function same as the mask may be provided on the back side surface of the base member. In other words, the effect of the present invention can also be realized by providing a structure for patterning light in the base member side of the photosensitive material. In addition, the patterned light may be generated by scanning laser ray or the like in a desired pattern or using an area light source such as an LED panel composed of a dot matrix that can be patterned, to perform exposure process for the photosensitive material.

First Embodiment

A layer forming method according to the first embodiment of the present invention is illustrated in FIG. 1. FIG. 1 shows the cross sectional structure of layers or a sheet taken along the thickness direction in various stages of the process. The method according to this embodiment is intended to form an electrode layer having a specific thickness and shape. In the method according to this embodiment, a photosensitive layer 6 for forming an electrode layer is applied on a member composed of a base member 2 made of a light transmissive film (e.g. a PET film) and a light transmissive insulating layer 4 formed thereon (step 1). Next, in step 2, a mask 8 having a desired pattern formed thereon is disposed in close contact with the back side surface of the base member 2, and ultraviolet radiation is applied from the back side thereof so that exposure of the photosensitive layer 6 is performed.

In connection with the present invention, the inventor discovered the fact that the depth of the cured portion in the photosensitive layer 6 measured from the surface of the light transmissive member (in this case, the insulating layer 4) can be controlled by controlling the intensity, radiation time or other factors concerning the ultraviolet light upon the exposure. In confirming the controllability of the thickness of the cured portion with the exposure amount, conditions such as the ratio of the ceramic powder mixed in a slurry, dispersibility of the powder, the average particle diameter of the powder, the transmittance of the powder were changed in various ways, and the thickness of the slurry that can be exposed was measured for each condition.

It is well known that when a material in which a ceramic powder or the like and a photosensitive binder are mixed (or kneaded) is exposed with light, diffusion of light generally occurs due to the presence of the ceramic powder or the like, so that the edge of the exposed portion is blurred. The applicant of the present patent application prepared mixtures in which a negative type binder and barium titanate powders having different average particle diameters of 1.0 μm, 0.8 μm, 0.6 μm, 0.4 μm and 0.2 μm respectively are mixed with a volume ratio of 1 to 1 and investigated the relationship between the irradiation time and the thickness of the film remaining after development. As a result, it was confirmed that in the case that the thickness of the remaining film is several microns, more specifically, for any powder, in the case that the thickness is about 10 μm or less, the exposure time and the thickness of the obtained sheet are in a linear relationship and variations in average film thickness values are in the range of ±0.5-2.0%. In addition, in order to keep flatness of the sheet, it can be said that smaller particle diameters are preferable. This depends on the thickness of the sheet, and in the smaller thickness range, the particle diameter is an important factor. Specifically, in the case that the sheet thickness is equal to or smaller than 5 μm, it is preferable to use barium titanate powder having an average particle diameter of equal to or smaller than 0.8 μm, and more preferably, equal to or smaller than 0.2 μm. In other words, a flat sheet can be obtained by using a slurry containing powder with an average particle diameter about one-fifth or less of the thickness of the sheet to be obtained. In addition, a sheet that is reduced in the degree of its surface unevenness (in terms of arithmetic average roughness Ra) can be obtained by using a slurry containing powder with an average particle diameter about one-twentieth or less of the thickness of the sheet to be obtained. Here, the exposure time can be interpreted to the exposure amount taking into account the light intensity, and the result shows that the exposure amount and the thickness of the remaining film are in a linear relationship. Therefore, in the case that a ceramic powder and a photosensitive binder are used, when the thickness of the remaining film is about 5.0 μm as with the thickness of the electrode, it is possible to keep an accurate sheet thickness and evenness of the sheet surface. Although the description of a specific investigation has been made in connection with the case in which barium titanate powders which are inferior in light transmitting characteristics are used, we also investigated so-called glass ceramic powders which are superior in light transmitting characteristics, ferrite powders having light absorbing properties and metal powders. As a result, these powders also showed characteristics similar to the barium titanate powders, though the required exposure amount was different. Therefore, in the case that the thickness of the film remaining after development is to be controlled by adjusting exposure amount while using a slurry in which a metal or ceramic powder and a photosensitive binder are mixed, if the average particle diameter of the powder used is smaller than 1.0 μm, the surface roughness can be made small and a control process that can reduce variations in the average film thickness can be made possible. In addition, with experiments other than mentioned above, it was discovered that the thickness of the film remaining after development can be controlled in the range of about 50 μm or less, if conditions permit. After the exposure, development is performed so that the portion of the photosensitive layer 6 other than the cured portion is removed. Thus, an electrode 10 having a specific shape and a specific thickness is obtained as shown in step 3. As will be described later, the base member 2 is removed from the obtained sheet composed of the base member 2, the insulating layer 4 and the electrode 10 as it is, or the base member 2 is removed from the sheet after an additional layer is formed thereon. The sheet from which the base member 2 has been removed is laminated with another sheet that has been made by the same process or a similar process, and formed into a multilayer electronic parts such as capacitors after undergoing various processes.

According to this embodiment, it is possible to make the surface of the cured portion even or flat while controlling the thickness (or depth) of the cured portion. As long as the base member 2 and the insulating layer 4 are transparent to light, this embodiment can be carried out only by adding the exposure process and the development process on top of the conventional coating or screen printing process.

In this embodiment, the shape and other factors of the electrode is determined by the mask pattern and the controlled exposure amount, and therefore the photosensitive layer may be applied by any existing process. However in order to reduce the removal amount in the development process, it is preferable that the size, shape and thickness of the photosensitive layer 6 formed on the insulating layer 4 be close to the size, shape and thickness of the electrode to be formed. In view of this, various methods including existing screen printing process or coating process using a blade may be adopted upon forming the photosensitive layer 6. In this embodiment, the insulating layer 4 is formed on the base member 2. This insulating layer 4 may be made of a photosensitive material and the insulating layer made of the photosensitive material may be exposed from the back side of the base member 2 so as to reduce variations in its thickness. In addition, various light transmissive layers may be formed in place of the insulating layer 4.

Second Embodiment

Figure 2:
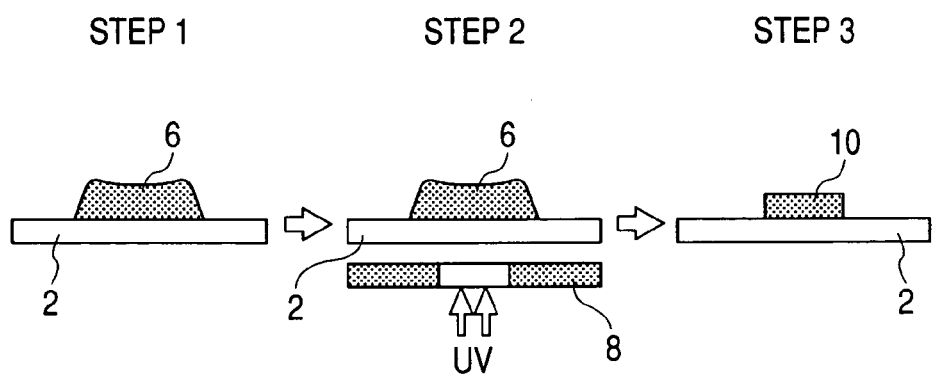
FIG. 2 is schematically shows a ceramic green sheet manufacturing process according to a second embodiment of the present invention.

FIG. 2 is a diagram similar to FIG. 1, which shows the cross sectional structure of layers or a sheet taken along the thickness direction in various stages of the process. The other drawing that will be referred to in the following shall also show the cross sectional structure of the sheet in various stages of a process. In this embodiment, an electrode 10 is formed directly on a light transmissive base member 2. In other words, this embodiment is equivalent to the case that the insulating layer 4 or a layer corresponding to the insulating layer 4 is eliminated from the first embodiment.

Specifically, a photosensitive layer 6 for forming an electrode layer is firstly applied on the light transmissive base member 2 made of, for example, a PET film (step 1). Next in step 2, a mask 8 having a desired pattern formed thereon is disposed in close contact with the back side surface of the base member 2, and ultraviolet radiation is applied from the back side thereof so that exposure of the photosensitive layer 6 is performed. After the exposure, development is performed so that the portion of the photosensitive layer 6 other than the cured portion is removed. Thus, an electrode 10 having a specific shape and a specific thickness is obtained as shown in step 3.

Third Embodiment

Figure 3:
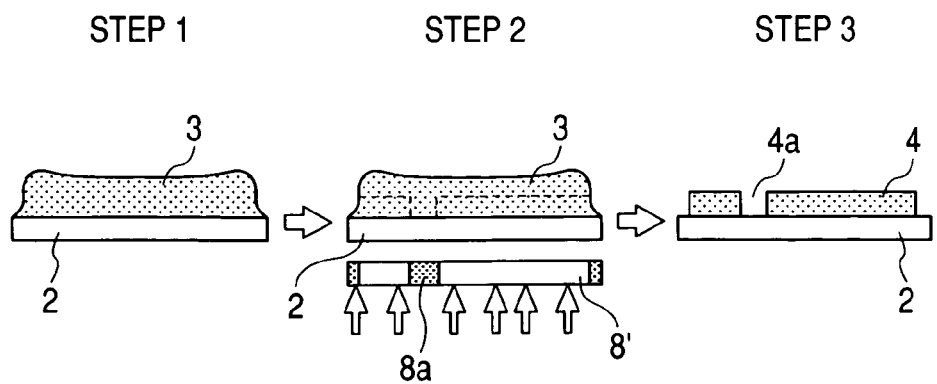
FIG. 3 is schematically shows a ceramic green sheet manufacturing process according to a third embodiment of the present invention.

The method according to this embodiment is intended to form a through hole used upon forming a penetrating electrode simultaneously when, for example, an dielectric layer is formed. In the following, the layer forming method will be specifically described with reference to FIG. 3 which illustrates this embodiment. Firstly in step 1, a photosensitive layer 3 having desired electric characteristics is formed on the upper surface of a light transmissive base member 2 made of, for example, a PET film. Next in step 2, a mask 8' having a desired pattern formed thereon is disposed in close contact with the back side surface of the base member 2, and ultraviolet radiation is applied from the back side thereof so that exposure of the photosensitive layer 3 is performed. After the exposure, development is performed so that the unexposed portion of the photosensitive layer corresponding to piercing pattern portion 8a is removed. Thus, a dielectric layer 4 having a through hole 4a is formed.

According to this embodiment, it is possible to make the surface of the dielectric layer 4 formed on the base member even or flat while controlling its thickness by controlling the exposure amount in step 2. In connection with this, the application thickness of the photosensitive layer 3 may be arbitrary determined so long as it is larger than the thickness of the dielectric layer, and no requirements are placed on the evenness and the uniformity in the thickness of the photosensitive layer 3. In view of this, various methods including existing screen printing process or coating process using a blade may be adopted upon forming the photosensitive layer 3. Although in this embodiment the photosensitive layer 3 is formed directly on the base member 2, various layers transparent to light may be formed in advance.

Fourth Embodiment

Figure 4:
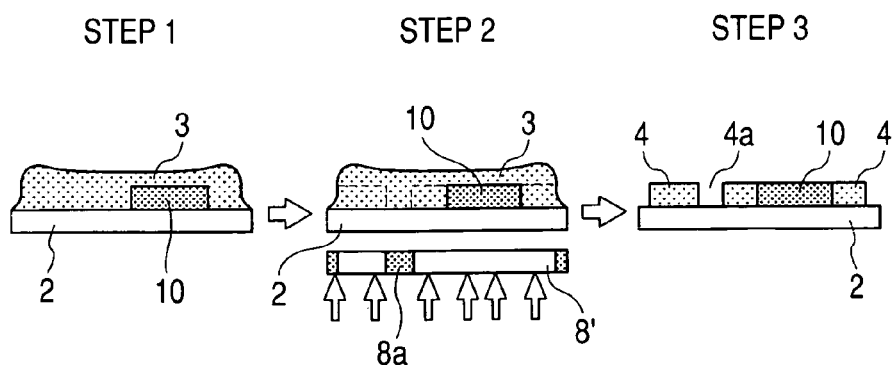
FIG. 4 is schematically shows a ceramic green sheet manufacturing process according to a fourth embodiment of the present invention.

Next, a fourth embodiment will be described with reference to FIG. 4. According to this embodiment, in a layer in which an electrode layer or the like is formed in the interior of an insulator portion, a through hole is formed on the insulator portion. In this case, the electrode layer or the like functions as a light blocking portion that does not transmit the light used in the exposure process. In this embodiment, a sheet composed of a light transmissive base member 2 and an electrode layer 10 formed on the surface of the base member 2 is prepared by, for example, the process according to the above-described second embodiment, and a photosensitive layer 3 having desired electric characteristics is formed on the top surface of the sheet (step 1). Next in step 2, a mask 8' having a desired pattern formed thereon is disposed in close contact with the back side surface of the base member 2, and ultraviolet radiation is applied from the back side thereof so that exposure of the photosensitive layer 3 is performed. After the exposure, development is performed so that the unexposed portion of the photosensitive layer corresponding to piercing pattern portion 8a is removed. Thus, a dielectric layer 4 having a through hole 4a is formed.

According to this embodiment, it is possible to make the surface of the dielectric layer 4 formed on the base member even or flat while controlling its thickness by controlling the exposure amount in step 2. In connection with this, the application thickness of the photosensitive layer 3 may be arbitrary determined so long as it is larger than the thickness of the dielectric layer, and no requirements are placed on the evenness and the uniformity in the thickness of the photosensitive layer 3. In view of this, various methods including existing screen printing process or coating process using a blade may be adopted upon forming the photosensitive layer 3. Although in this embodiment the photosensitive layer 3 is formed directly on the base member, various layers transparent to light may be formed in advance. In addition, although in this embodiment the thickness of the insulating layer 4 is designed to be approximately equal to the thickness of the electrode layer 10, the thickness may be differentiated by controlling the exposure amount in accordance with the desired shape of the sheet.

By carrying out this embodiment, it is possible to remove undesired portions such as sag or run-over that are generated when photosensitive material is applied on the surface of a base member or the like simply by keeping those portions unexposed. In addition, since it is not necessary to make the applied photosensitive material layer thin, faded portions will not be generated. In addition, according to the present invention, it is possible to control the thickness of the remaining layer precisely, by controlling the exposure amount. Thus, it is possible to form a layer with a thickness of, for example, smaller than 0.5 μm while reducing variations in thickness down to less than ±2 to 3%. Furthermore, it is possible to make the edge portion of a patterned shape obtained by the exposure and development more square in shape, as compared to that formed by conventional technologies. Thus, it is possible to make variations of electric characteristics of electronic parts produced by laminating the sheets smaller than a desired value. (Examples of Manufacturing Process of Electronic Parts Using a Sheet according to the Invention)

Figure 5:
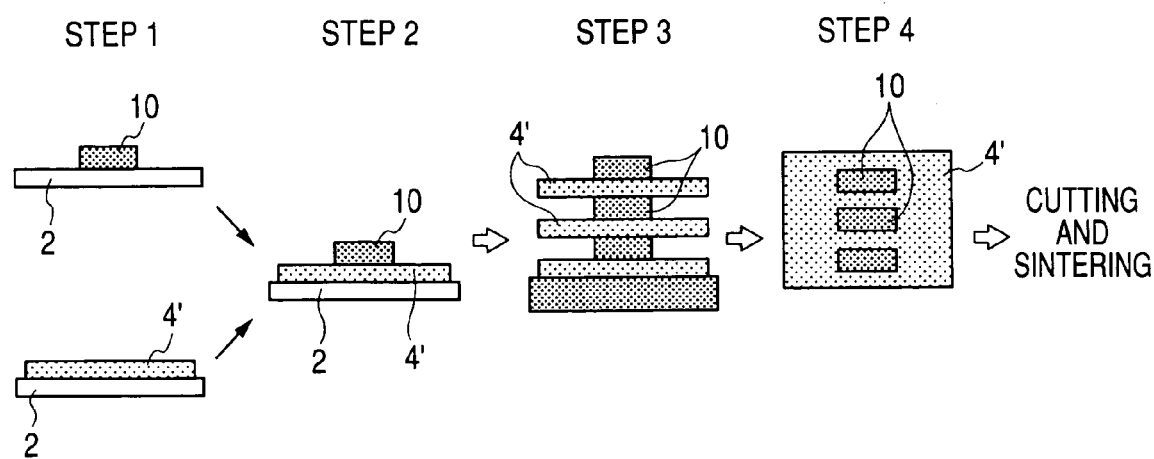
FIG. 5 schematically shows a process of actually manufacturing multilayer ceramic capacitors using a ceramic green sheet produced by a method according to the present invention.
Figure 6:
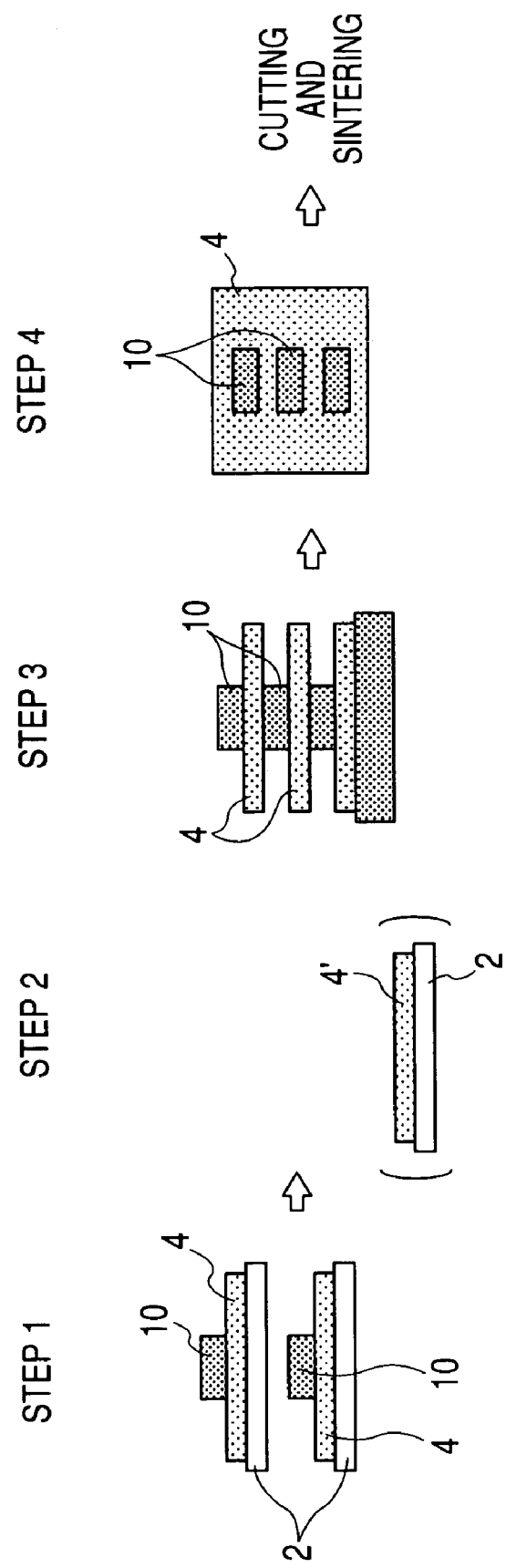
FIG. 6 schematically shows a process of actually manufacturing multilayer ceramic capacitors using a ceramic green sheet produced by a method according to the present invention.
Figure 7:
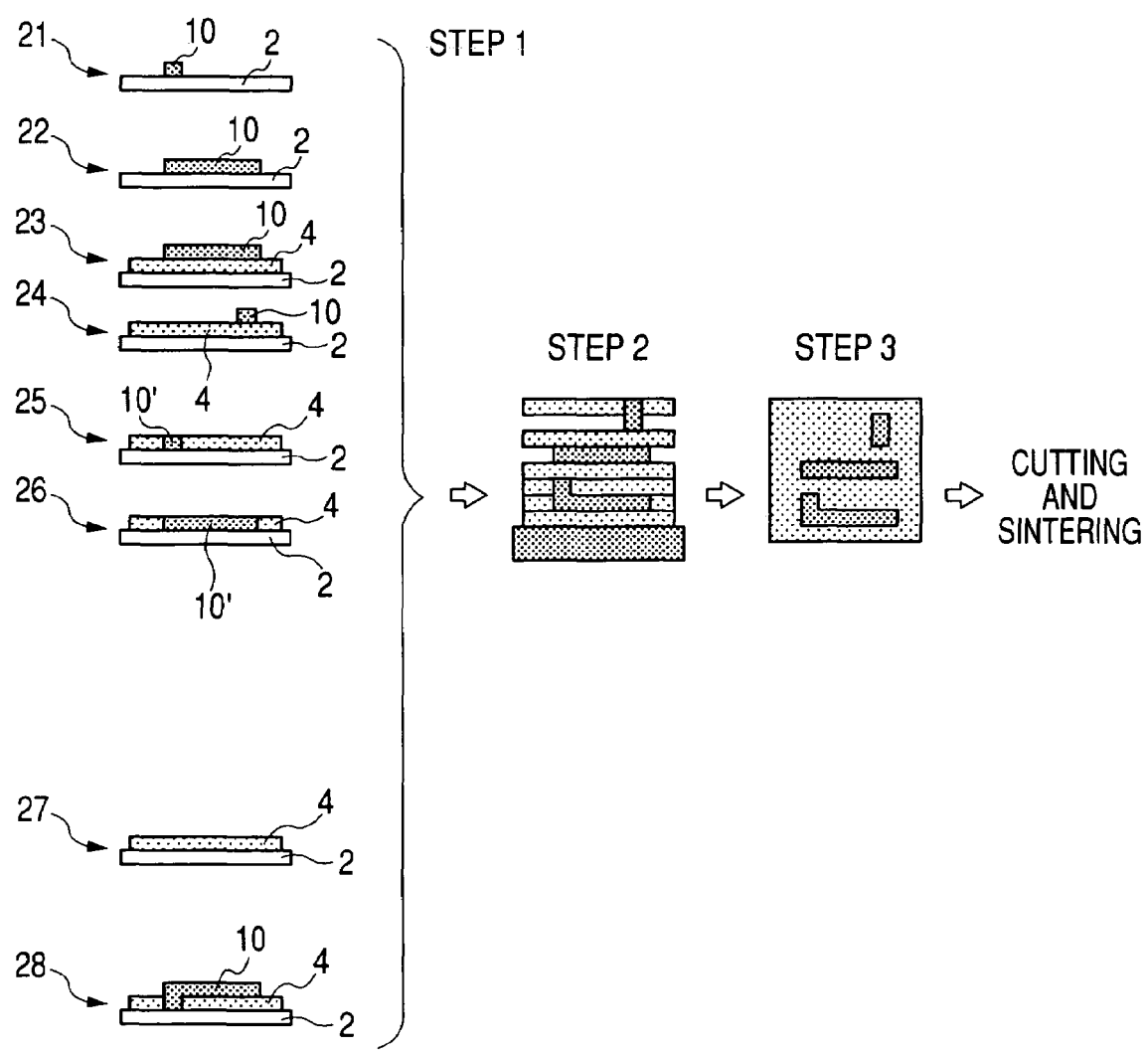
FIG. 7 schematically shows a process of actually manufacturing multilayer ceramic inductors using a ceramic green sheet produced by a method according to the present invention.

In the following, a process of manufacturing electronic parts using a sheet produced by the above-described sheet forming method according to the present invention will be described. FIGS. 5 to 7 that will be referred to in the description of the process show cross sections of a sheet or laminated sheets taken in the thickness direction as seen from the side. FIGS. 5 and 6 show various stages of a process of manufacturing multilayer ceramic capacitors. FIG. 7 shows various stages of a process of manufacturing multilayer ceramic inductors.

FIG. 5 shows a process in the case in which an electrode layer 10 produced by the above-described second embodiment and a dielectric layer (a so-called ceramic green sheet) 4' are used. In that manufacturing process, a plurality of sheets each of which is composed of a base member 2 and an electrode layer 10 formed thereon and a plurality of sheets each of which is composed of a base member 2 and a dielectric layer 4' formed thereon are prepared (step 1). Next in step 2, the base layer 2 is detached from the electrode layer 10 and only the electrode layer 10 is brought onto the top surface of the dielectric layer 4' on the base member 2. From the sheet thus obtained in which the electrode layer 10 is formed on the dielectric layer 4', the base member 2 on the bottom surface of the dielectric layer 4' is further removed. Then, a predetermined number of sheets composed of only the dielectric layer 4' and the electrode layer 10 are stacked (step 3).

A pressure is applied to the stacked sheets in the thickness direction to bring the sheets in pressure contact with each other. With this press process, the electrode layers 10 intrude into the respective upper and lower dielectric layers 4'. Thus, a laminated member in which a plurality of electrode layers 10 are present in the interior of the dielectric member 4' is produced as shown in step 4. The laminated member thus produced is cut into a specific size and subjected to baking, so that a desired multilayer ceramic capacitor is produced. With the use of the electrode layer 10 with reduced variations in surface evenness, shape and thickness produced by the method according to the present invention, it is possible to produce multilayer ceramic capacitors in which variations in a certain electric characteristic are small as compared to conventional multilayer ceramic capacitors.

FIG. 6 shows a process in the case that a plurality of sheets produced by the above-described first embodiment each of which is composed of an insulator (or dielectric) layer 4 and an electrode layer 10 are used (step 1). In this manufacturing process, sheets in which a dielectric layer 4' is formed on the base member 2 (only the dielectric layer 4') may be used if desired (step 2). Next in step 3, the base member 2 is removed from the sheets, and a predetermined number of sheets composed of only the dielectric layer 4 and the electrode layer 10 are stacked. After that, a pressure is applied to the stacked sheets in the thickness direction to bring the sheets in pressure contact with each other. With this press process, the electrode layers 10 intrude into the respective upper and lower insulator layers 4. Thus, a laminated member in which a plurality of electrode layers 10 are present in the interior of the insulator layer 4 is produced as shown in step 4.

The laminated member thus produced is cut into a specific size and subjected to baking, so that a desired multilayer ceramic capacitor is obtained. With the use of the electrode layer 10 and insulator layer 4 that are superior in surface evenness, precision in shape and variations in thickness produced by the method according to the invention, it is possible to produce multilayer ceramic capacitors in which variations in a certain electric characteristic are small as compared to conventional multilayer ceramic capacitors. In this case, since uniformity in the thickness of the insulator layer 4 is improved as compared to the case shown in FIG. 5, multilayer ceramic capacitors with reduced variations in electric characteristics can be produced.

FIG. 7 shows various stages in a process of manufacturing multilayer ceramic inductors. The sheet 21 shown in FIG. 7 is produced by the method according to the second embodiment. Sheet 21 is composed of a base member 2 and an electrode layer 10 for forming a penetrating electrode 10 formed thereon. Sheet 22 is also produced by the method according to the second embodiment. In the sheet 22, an electrode 10 for forming a pattern electrode is formed on a base member 2. Sheet 23 is produced by the method according to the first embodiment. In the sheet 23, an insulating layer 4 and an electrode 10 for forming a pattern electrode are formed on a base member 2. Sheet 24 is also produced by the method according to the first embodiment. In the sheet 24, an insulating layer 4, and an electrode for forming a penetrating electrode are formed on a base member 2.

Sheet 25 is produced by filling a through hole of an insulating layer 4 produced by the method according to the third embodiment with an electrode material 10' by an appropriate process. In the sheet 25, the insulating layer 4 and the penetrating electrode are formed on a base member. Sheet 26 is also produced by filling a pattern hole of an insulating layer 4 produced by the method according to the third embodiment with an electrode material 10' by an appropriate process. In the sheet 26, the insulating layer 4 and the pattern electrode are formed on a base member 2. Sheet 27 is produced using a conventional technology, and it is composed of an insulating layer 4. Sheet 28 is also produced using a conventional technology, and it is composed of an insulating layer 4, a penetrating electrode and a pattern electrode 10.

Some of these sheets 21-28 are selected as desired and stacked after their base member 2 is removed in such a way that a desired inductor pattern can be formed (step 2). After that, a pressure is applied to the stacked sheets in the thickness direction to bring the sheets in pressure contact with each other. With this press process, the electrode layers 10 intrude into the respective upper and lower insulator layers 4. Thus, a laminated member in which continuous electrode layers 10 of the desired inductor pattern are present in the interior of the insulator layer 4 is produced as shown in step 3.

The laminated member thus produced is cut into a specific size and subjected to baking, so that a desired multilayer ceramic inductor is obtained. With the use of the electrode layer 10 with reduced variations in surface evenness, shape and thickness produced by the method according to the invention, it is possible to produce multilayer ceramic inductors in which variations in a certain electric characteristic are small as compared to conventional multilayer ceramic inductors. The cross section of the pattern electrode or other parts produced by the method of the present invention has a preferable square shape as compared to those produced by conventional methods, and therefore advantageous effects such as reduction of variations in the resistance of the inductor from a desired value or reduction of DC resistance are realized.

This application claims priority from Japanese Patent Application No. 2003-304209 filed Aug. 28, 2003, which is hereby incorporated by reference herein.

What is claimed is:

1. A method for manufacturing a ceramic green sheet utilizing an exposure process and a development process, comprising:

attaching a photosensitive material including a powder having a specific electric characteristic to a front side surface of a member having a portion that can transmit light used in said exposure process, said photosensitive material being sensitive to said light, and said front side surface being a surface on which a sheet is to be formed;

shaping said light into a predetermined pattern by passing through a mask disposed on the back side of said member and irradiating said photosensitive material with that light from the back side only of said member to irradiate said photosensitive material with that light which is shielded by said predetermined pattern and to perform said exposure process with such an exposure amount that said photosensitive material is cured to a predetermined depth within a range below the thickness of the photosensitive material attached on the surface of said member; and performing said development process on said photosensitive material after said exposure process.

2. A manufacturing method according to claim 1, further comprising a step of forming a light blocking portion composed of a material that does not transmit said light on a predetermined area of the front side surface of said member, prior to said step of attaching said photosensitive material to the front side surface of said member.

3. A manufacturing method according to claim 2, wherein said predetermined depth is equal to the thickness of said light blocking portion.

4. A manufacturing method according to claim 1, wherein a releasing processing is applied to said member to facilitate release of said ceramic green sheet from the surface of said member.

5. A manufacturing method according to claim 1, wherein said member includes a portion to be detached and removed from said ceramic green sheet and a portion that will constitute a part of said ceramic green sheet.

6. A method for manufacturing a multilayer ceramic electronic part comprising the steps of:

stacking a plurality of ceramic green sheets including a ceramic green sheet produced by a method for manufacturing a ceramic green sheet according to any one of claims 1 or 2-5; and applying a pressure to said stacked ceramic green sheets in their thickness direction to form a laminated member.

* * * * *